United States Patent [19]
Chang

[11] Patent Number: 5,986,889
[45] Date of Patent: Nov. 16, 1999

[54] DOCK KIT INTERFACE PORT FOR IN-TRAY OF MOBILE RACK

[76] Inventor: Cheng-Chun Chang, 11F-2, No. 11, 202 Lane, Jing-Shing Rd., Wen-Shan, Taipei, Taiwan

[21] Appl. No.: 08/995,748

[22] Filed: Dec. 22, 1997

[51] Int. Cl.⁶ ....................................................... G06F 1/16
[52] U.S. Cl. ........................ 361/725; 439/928.1; 361/685; 361/686
[58] Field of Search .................................. 361/685, 686, 361/725; 312/223.2; 439/928.1

[56] References Cited

U.S. PATENT DOCUMENTS

| | | | |
|---|---|---|---|
| 5,349,483 | 9/1994 | Tsai | 361/685 |
| 5,442,513 | 8/1995 | Lo | 361/685 |
| 5,563,767 | 10/1996 | Chen | 361/685 |
| 5,694,290 | 12/1997 | Chang | 361/685 |

*Primary Examiner*—Leo P. Picard
*Assistant Examiner*—John D. Reed
*Attorney, Agent, or Firm*—Smith, Gambrell & Russell, LLP

[57] ABSTRACT

A dock-kit interface port on an in-tray of a mobile rack which includes casing, an interface circuit board mounted inside the casing and having an interface circuit, an in-tray connector soldered to the interface circuit board at one side and connected to an electric connector on the in-tray, and at least one interface connector soldered to the interface circuit board at an opposite side and adapted for connecting to a computer by a cable, a power connector mounted on the rear cover shell and connected to the interface circuit and adapted to receive power supply from a power supply outlet through a transformer circuit, a power switch mounted on the rear cover shell for power on/off control.

1 Claim, 5 Drawing Sheets

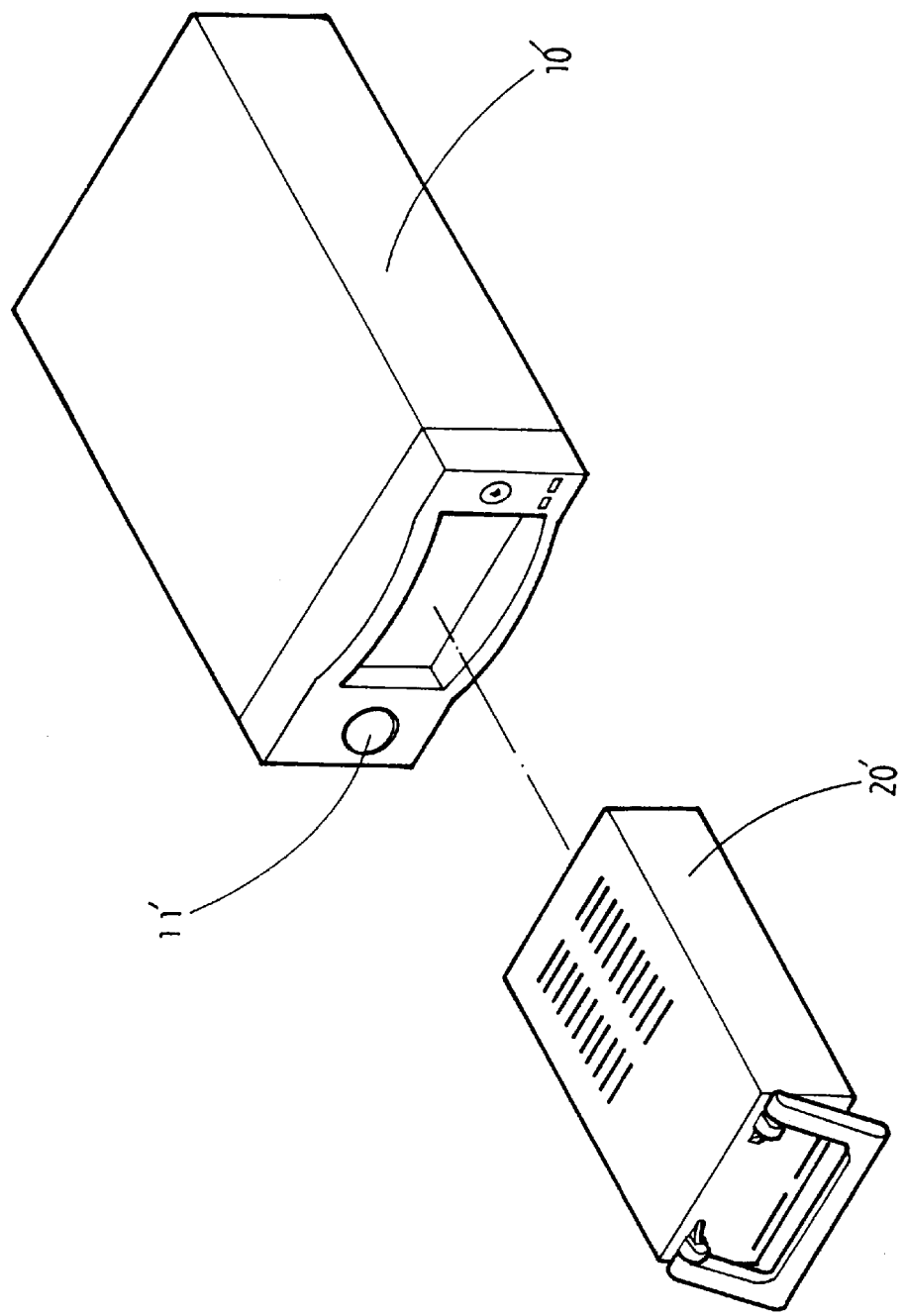
FIG. 1 (A) PRIOR ART

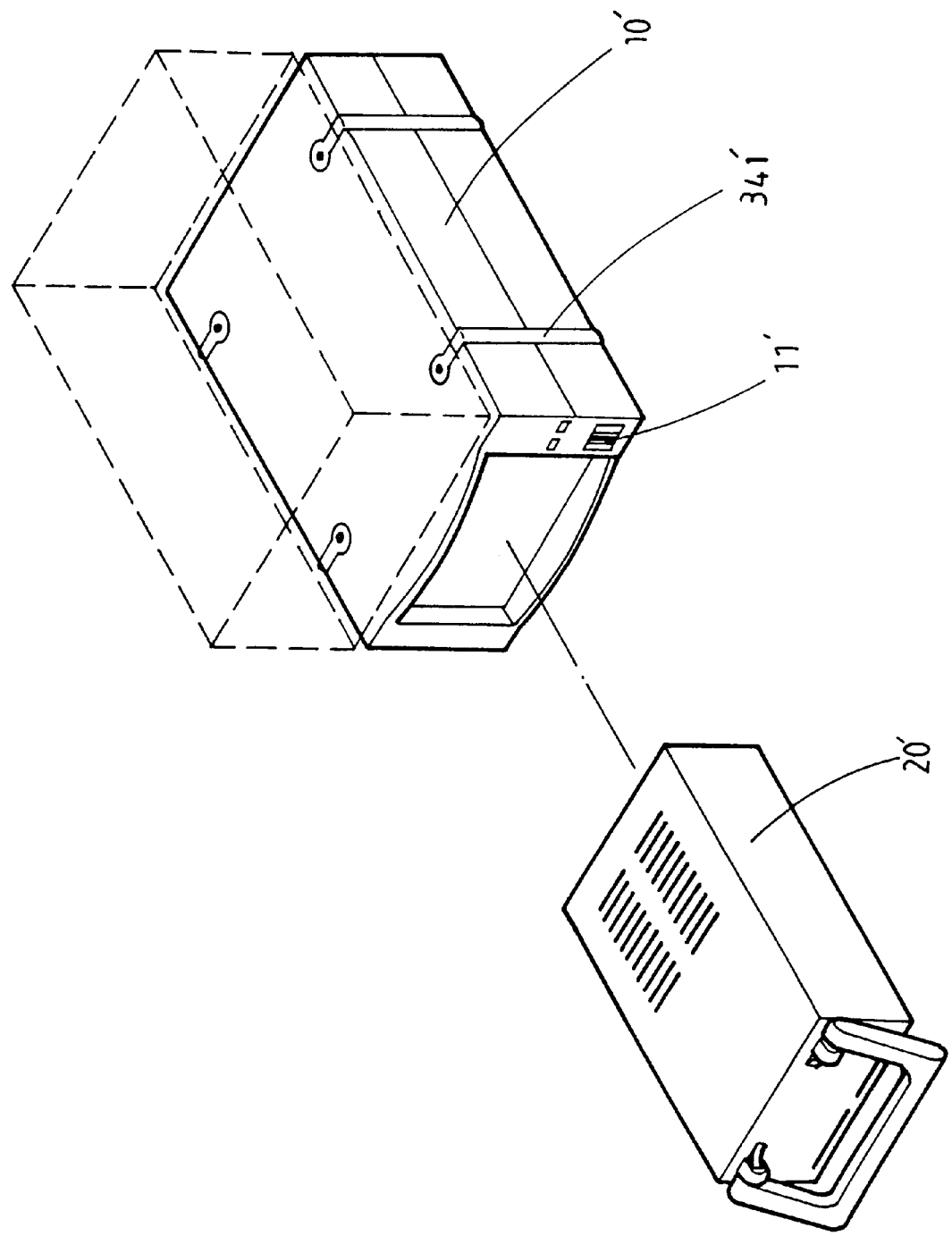
FIG. 2 (A) PRIOR ART

DOCK KIT INTERFACE PORT FOR IN-TRAY OF MOBILE RACK

BACKGROUND OF THE INVENTION

The present invention relates to a dock kit interface port for an in-tray of a mobile rack which has an in-tray connector for connection to an in-tray, at least one interface connector for connection to a computer, a power connector for connection to a power supply outlet through a transformer circuit, and a power switch for power on/off control.

Mounting a hard diskdrive in an in-tray inside a mobile rack is a well known technique. When a hard diskdrive is installed in an in-tray of a mobile rack, an interface circuit must be provided for communication between the hard diskdrive and the computer. FIGS. 1A and 1B show an in-tray and mobile rack assembly according to the prior art, in which a power inverter circuit 12', an interface circuit 18', a power connector 13', a fan 14', an interface connector 15', a ribbon cable 17, a power control circuit 11' and an in-tray connector 16' are mounted inside the metal mobile rack 10'; an insertion chamber 19 is defined within the metal mobile rack 10' for receiving the in-tray 20'. Because the mobile rack 10' has a variety of accessories mounted on the inside, the whole assembly of the mobile rack 10' is heavy and occupies much installation space. FIGS. 2A and 2B show a similar structure in which the metal mobile rack 10' has plastic strips 341' mounted on two opposite lateral sides for protection. However, this structure of in-tray and mobile rack assembly has the same drawbacks as before stated.

SUMMARY OF THE INVENTION

The present invention provides a dock kit interface port which eliminates the aforesaid drawbacks. According to one aspect of the present invention, the dock-kit interface port comprises an interface circuit board having an in-tray connector at one side for connection to an electric connector at the rear side of an in-tray of a mobile rack and at least one interface connector at an opposite side for connection to a computer, a power connector adapted to receive power supply from a power supply outlet through a transformer circuit, and a power switch for power on/off control. According to another aspect of the present invention, U-shaped protective plastic clamps are provided for vertically clamping on two opposite lateral sides of the in-tray for protection. Each U-shaped plastic clamp has a recessed portion at the top side and a raised portion at the bottom side, so that the raised portions on the U-shaped plastic clamps of an in-tray at the top can be forced into engagement with the recessed portions on the U-shaped plastic clamps on an in-tray at the bottom when two in-trays are arranged in a stack.

BRIEF DESCRIPTION OF THE DRAWINGS

FIG. 1A is an exploded view of an in-tray and mobile rack assembly according to the prior art.

FIG. 2A is an exploded view of another structure of in-tray and mobile rack assembly according to the prior art.

DETAILED DESCRIPTION OF THE PREFERRED EMBODIMENT

Figure 1B:
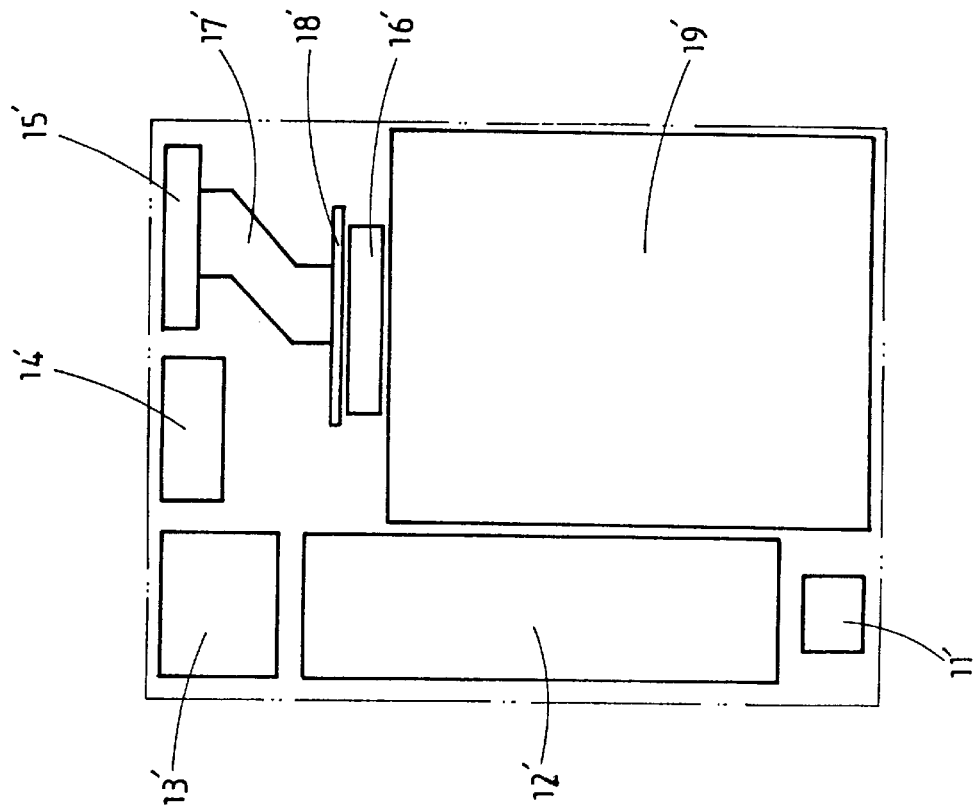
FIG. 1B is a plan view of the assembly of FIG. 1A, showing the in-tray installed in the mobile rack.
Figure 2B:
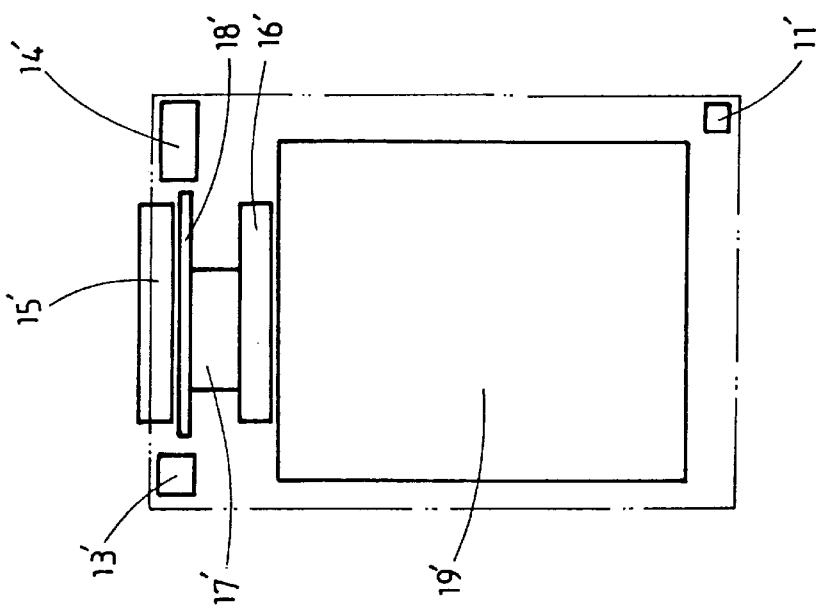
FIG. 2B is a plan view of the assembly of FIG. 2A, showing the in-tray installed in the mobile rack.
Figure 3:
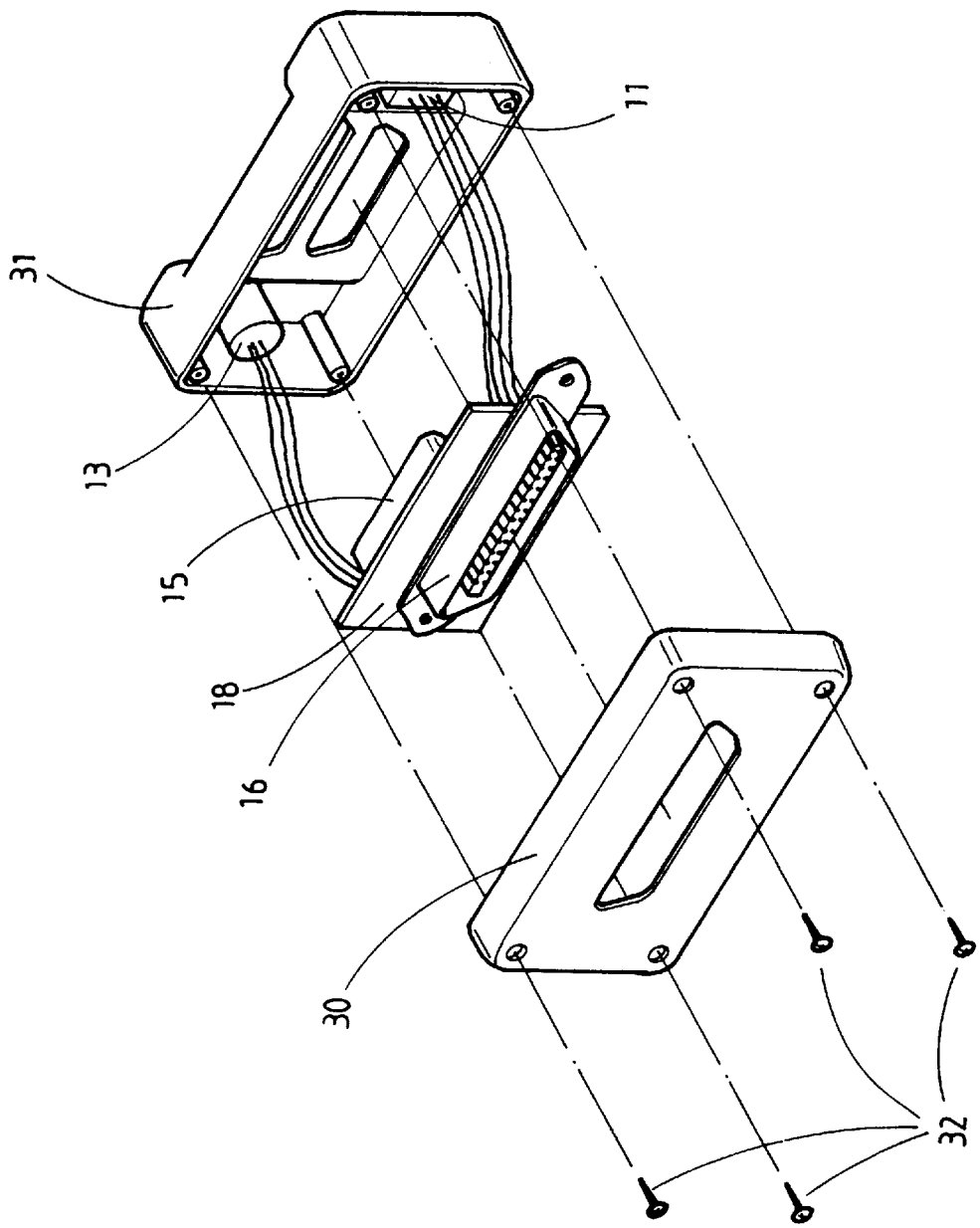
FIG. 3 is an exploded view of the present invention.

Referring to FIG. 3, a dock-kit interface port in accordance with the present invention is generally comprised of an rectangular interface circuit board 18 which comprises the designed interface circuit, an in-tray connector 16 soldered to a first side of the interface circuit board 18, male and female interface connectors 15 soldered to a second side of the interface circuit board 18. The assembly of the interface circuit board 18, in-tray connector 16 and interface connectors 15 is mounted inside a casing, which is comprised of front cover shell 30 and a rear cover shell 31. The front cover shell 30 and the rear cover shell 31 are fastened together by screws 32. A power control switch 11 and a power socket 13 are provided at the rear cover shell 31. The power socket 13 is adapted to receive power supply from a power supply outlet through a transformer circuit. The power control switch 11 is for power on/off control.

Figure 4:
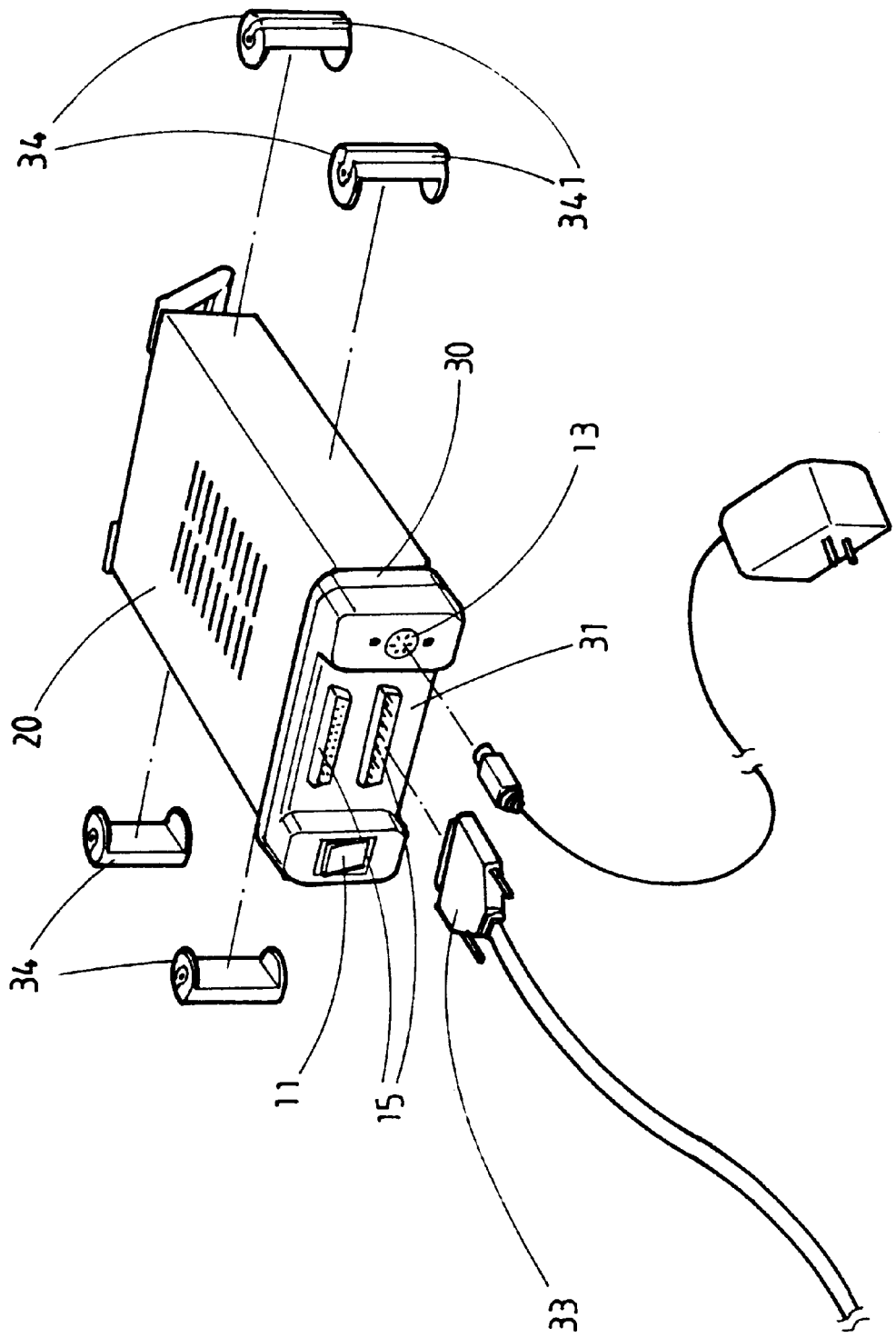
FIG. 4 is an applied view of the present invention, showing the dock kit interface port mounted on an in-tray.

Referring to FIG. 4 and FIG. 3 again, when the dock-kit interface port is installed in an in-tray 20, the in-tray connector 16 is connected to a connector (not shown) at the rear side of the in-tray 20, then one interface connector 15 is connected to the computer by a cable 33, and then the power socket 13 is connected to a power supply outlet through a transformer circuit. When the power control switch 11 is switched on, the hard disk drive in the in-tray 20 is started. Furthermore, substantially U-shaped protective plastic clamps 34 are vertically clamped on two opposite lateral sides of the in-tray 20 for protection. Each U-shaped plastic clamp 34 has a reinforcing rib 341 longitudinally disposed at an outer side. Further, the U-shaped plastic clamps 34 preferably have each a recessed portion at the top side and a raised portion at the bottom side, so that the raised portions on the U-shaped plastic clamps of an in-tray at the top can be forced into engagement with the recessed portions on the U-shaped plastic clamps on an in-tray at the bottom when two in-trays are arranged in a stack.

While only one embodiment of the present invention has been shown and described, it will be understood that various modifications and changes could be made thereunto without departing from the spirit and scope of the invention disclosed. For example, the in-tray 20 may be provided to hold a high capacity data storage device such as ZIP, MO, LS-120; the interface circuit board can be designed to support local data transmission interface standards (IDE, SCSI, EPP, PCMCIA, etc.).

What the invention claimed is:

1. A dock-kit interface port on an in-tray of a mobile rack, comprising a casing formed of a front cover shell and a rear cover shell, the front cover shell and rear cover shell being fastened together by screws, an interface circuit board mounted inside the casing and having an interface circuit, an in-tray connector soldered to the interface circuit board at one side and connected to an electric connector on the in-tray, and at least one interface connector soldered to the interface circuit board at an opposite side and adapted for connecting to a computer by a cable, a power connector mounted on the rear cover shell and connected to the interface circuit and adapted to receive power supply from a power supply outlet through a transformer circuit, a power switch mounted on the rear cover shell for power on/off control, and a plurality of substantially U-shaped plastic clamps vertically clamped on two opposite lateral sides of the in-tray for protection, the U-shaped plastic clamps having each a recessed portion at a top side and a raised portion at a bottom side, the size of the raised portion fitting the raised portion.

* * * * *